United States Patent
Ho

[19]

[11] Patent Number: 5,266,516
[45] Date of Patent: Nov. 30, 1993

[54] METHOD FOR MAKING ELECTRICAL CONTACT THROUGH AN OPENING OF ONE MICRON OR LESS FOR CMOS TECHNOLOGY

[75] Inventor: Bernard W. K. Ho, Fremont, Calif.

[73] Assignee: Chartered Semiconductor Manufacturing Pte Ltd, Singapore, Singapore

[21] Appl. No.: 815,745

[22] Filed: Jan. 2, 1992

[51] Int. Cl.$^5$ .............................. H01L 21/70
[52] U.S. Cl. ........................... 437/57; 437/189; 437/944; 148/DIG. 51
[58] Field of Search ............ 437/57, 187, 189, 944; 148/100, DIG. 51

[56] References Cited

U.S. PATENT DOCUMENTS

| | | | |
|---|---|---|---|
| 4,451,971 | 6/1984 | Milgram | 437/188 |
| 4,475,382 | 10/1984 | Takasugi | 437/40 |
| 4,584,761 | 4/1986 | Wu | 437/41 |
| 4,631,806 | 12/1986 | Poppert et al. | 148/100 |
| 4,687,541 | 8/1987 | Penney | 437/228 |
| 4,696,098 | 9/1987 | Yen | 437/187 |
| 4,700,462 | 10/1987 | Beaubien et al. | 437/187 |
| 4,769,343 | 9/1988 | Fathimulla et al. | 437/187 |
| 4,771,017 | 9/1988 | Tobin et al. | 437/203 |
| 4,851,361 | 7/1989 | Schumann et al. | 437/57 |
| 4,894,350 | 1/1990 | Zwicknagl et al. | 437/184 |
| 5,112,765 | 5/1992 | Cederbaum et al. | 437/57 |

FOREIGN PATENT DOCUMENTS

| | | | |
|---|---|---|---|
| 0141222 | 8/1984 | Japan | 148/100 |
| 0200732 | 9/1987 | Japan | 148/187 |

*Primary Examiner*—Olik Chaudhuri
*Assistant Examiner*—Long Pham
*Attorney, Agent, or Firm*—George O. Saile

[57] ABSTRACT

A new method to produce a contact or via opening and filled metallurgy for integrated circuits. An insulating layer structure is formed over semiconductor device structures. A resist mask with substantially vertical sided openings is formed in the mask over the insulating layer and above the device elements to be electrically contacted. These device elements can be, for example source/drain regions in the semiconductor substrate, a metallurgy layer interconnecting other device element and the like. The exposed insulating layer is isotropically etched to a depth of between about 500 to 850 Angstroms to form a break in the vertical sided opening under construction. The exposed insulating layer is anisotropically etched to complete the construction of the substantially vertical sided openings through the insulating layer to a device element to be electrically contacted. A metal layer is sputter deposited over the exposed surfaces including the device elements at the bottom of the vertical sided openings, while substantially not depositing the metal upon the vertical sides of the openings. The resist mask and the metal thereover is removed by etching with the break being the attacking point of the resist etching fluid. A next level metallurgy is deposited over the exposed surfaces including the metal remaining in the vertical sided openings to form the next metallurgy level and to complete contact.

20 Claims, 3 Drawing Sheets

METHOD FOR MAKING ELECTRICAL CONTACT THROUGH AN OPENING OF ONE MICRON OR LESS FOR CMOS TECHNOLOGY

BACKGROUND OF THE INVENTION (1) Field of the Invention

This invention relates to the fabrication of integrated circuit devices and more particularly to a method of forming contact or via metallurgy of about one micron feature size or less to devices in an integrated circuit structure.

(2) Description of the Prior Art

In current practice, there is a problem with poor step coverage of sputtered metal in contacts or via holes of high aspect ratio (defined as the ratio of depth of the opening to the diameter of the hole). In particular, problems occur when the opening is less than 1 micron in diameter and the aspect ratio is greater than 1.

Metallurgy by Chemical Vapor Deposition is not desirable because it requires significant capital investment and increase of process complexity. Sputtering will result in thinning of the metal at the sidewall of the contact/via when openings are small and of the order of 1 micron or less.

Workers in the field have used the lift off method for forming conductive lines on semiconductor and ceramic packaging surfaces. The U.S. Pat. Nos. 4,451,971 (Fairchild), 4,700,462 (Hughes), 4,687,541 (Rockwell) and 4,769,343 (Allied-Signal) describe such processes using vacuum evaporation as the deposition method. U.S. Pat. No. 4,584,761 (DEC) describes such lift off method using sputtering as the metal deposition technique. U.S. Pat. No. 4,696,098 gives extensive information on sputtering with narrow and deep trenches involving the coverage of the deposited layer.

Other workers in the field have attempted to use the lift off technique for contact deposition. These include U.S. Pat. Nos. 4,771,017 (Spire), 4,975,382 (Rohm) and 4,894,350 (Siemens). In all of these methods a reverse sloping resist mask opening is used which takes up horizontal real estate which in the past was not a problem, but in the one micron and below era this loss of real estate is not satisfactory.

SUMMARY OF THE INVENTION

A principal object of the invention is to provide an effective and very manufacturable method to increase metal step coverage in contact or via holes of high aspect ratio.

Another object of this invention is to provide a method for formation of contact and via metallurgy for feature size openings in the order of one micron or less in integrated circuit devices.

Yet another object of this invention is to avoid contact plug etch back in the formation of contact metallurgy for feature size openings in the order of one micron or less in integrated circuit devices.

In accordance with these objects of this invention, a new method to produce a contact or via opening and filled metallurgy for CMOS or the like integrated circuits is achieved. A method for making electrical contact through an opening of about one micron or less begins by providing semiconductor device structures in and on a semiconductor substrate. An insulating layer structure is formed over the semiconductor device structures. A resist mask with substantially vertical sided openings of one micron or less feature size is formed in the mask over the insulating layer and above the device elements to be electrically contacted. These device elements can be, for example source/drain regions in the semiconductor substrate, a metallurgy layer interconnecting other device element and the like. The exposed insulating layer is isotropically etched to a depth of between about 500 to 850 Angstroms to form a break in the vertical sided opening under construction. The exposed said insulating layer is anisotropically etched to complete the construction of the substantially vertical sided openings through the insulating layer to a device element to be electrically contacted. A metal layer is sputter deposited over the exposed surfaces including the device elements at the bottom of the vertical sided openings, while substantially not depositing the metal upon the vertical sides of the openings. The resist mask and the metal thereover is removed by etching with the break being the attacking point of the resist etching fluid. A next level metallurgy is deposited over the exposed surfaces including the metal remaining in the vertical sided openings to form the next metallurgy level and to complete the electrical contact.

BRIEF DESCRIPTION OF THE DRAWINGS

In the accompanying drawings forming a material part of this description, there is shown.

DESCRIPTION OF THE PREFERRED EMBODIMENTS

Figure 1:
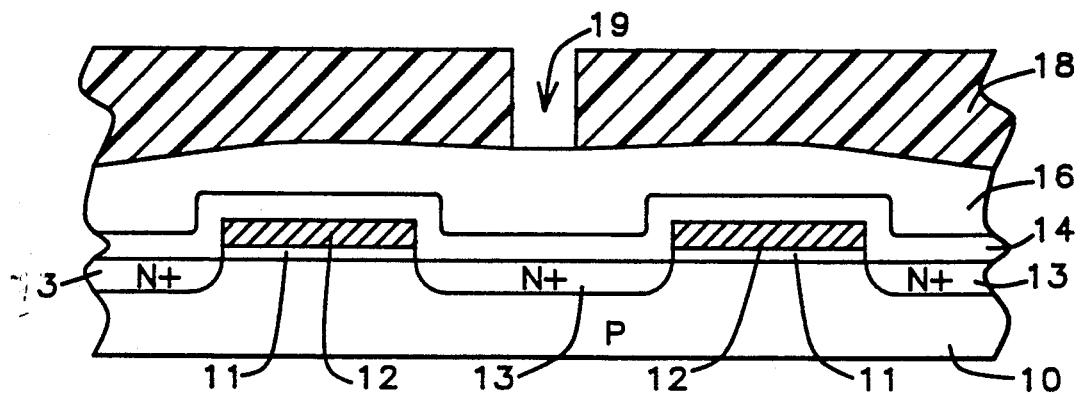
FIGS. 1 through 5 schematically illustrate in cross-sectional representation one preferred embodiment of this invention involving the formation of a contact plug to device regions formed within the semiconductor substrate.

Referring now more particularly to FIGS. 1–5, there is shown a schematic cross-sectional representation of the present invention at an early stage of manufacture. The product under manufacture can be either an N-channel MOSFET, a P-channel MOSFET or a CMOS FET. However, the FIGS. 1 through 5 process is intended to schematically show a CMOS FET process that makes a electrical contact to both P+ and N+ source/drain regions. The P substrate 10 is monocrystalline silicon and has been doped by conventional techniques to either P (or N not shown) as is appropriate for the desired N-channel (or P-channel not shown) MOS FET structure. An example of such a conventional process is described in the book "VLSI TECHNOLOGY" Second Edition by S. M. Sze Published by McGraw-Hill Book Co., New York, N.Y. 1988 Pages 485–487.

Gate dielectric 11, gate electrode 12 and source/drain N+ regions 13 are formed by conventional methods as described, for example by Sze cited above in the appropriate regions of substrate 10. An insulating layered structure composed of a layer of silicon dioxide 14 and a much thicker layer of borophosphosilicate glass, phosphosilicate glass or similar insulating layer 16. The operational thicknesses of these layers and between about 500 to 1000 Angstroms for the oxide layer and between about 4000 to 6000 or more Angstroms for the doped glass layer. These layers are typically deposited by chemical vapor deposition in low pressure or atmospheric pressure, or in a plasma enhanced reactive chamber.

After glass reflow at typically 950° C., the contact windows or openings are now formed through the insulating layered structure to the source/drain regions 13 in the device regions by the new lift off and sputtering process of the present invention. A resist mask 18 is formed by lithography and etching techniques over insulating layer 16 to provide one micron or less openings 19 in the mask 18 over the device elements to be electrically contacted. This completes the FIG. 1 structure.

Figure 2:
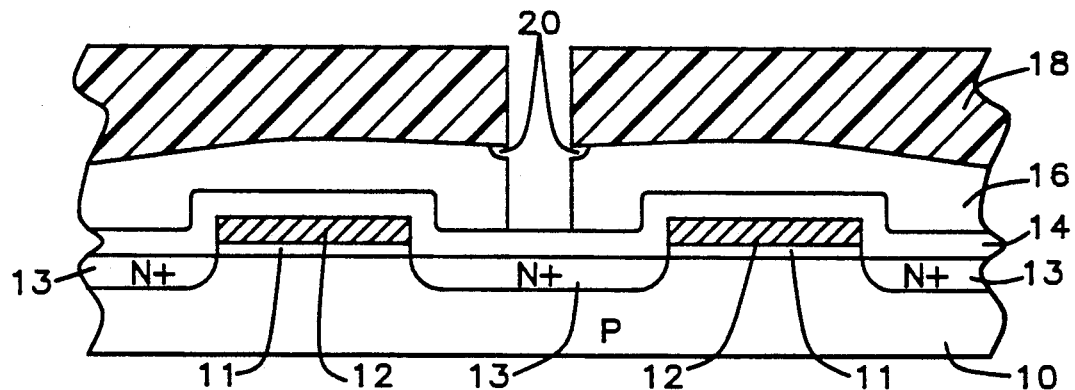

Referring to FIG. 2, the critical formation of the break 20 is formed by the use of a special isotropic etching step. This may be achieved by wet buffered hydrofluoric acid etch at room temperature. The etch time is based upon the etch rate of material of layer 16 in the wet etchant. Typically, the target layer 16 etch is 500 to 800 Angstroms to be removed. For commonly used silicon oxide for layer 16, the typical etch time is 30 to 90 seconds.

The next step is anisotropic etching of the remaining thickness of the insulating layer 16 and layer 14 to the source/drain regions 13. A typical reactive ion etching process using carbon tetrafluoride/oxygen at low pressure such as about 50 mTorr accomplishes the construction of the substantially vertical sided opening to the regions 13. This completes the FIG. 2 structure.

Figure 3:
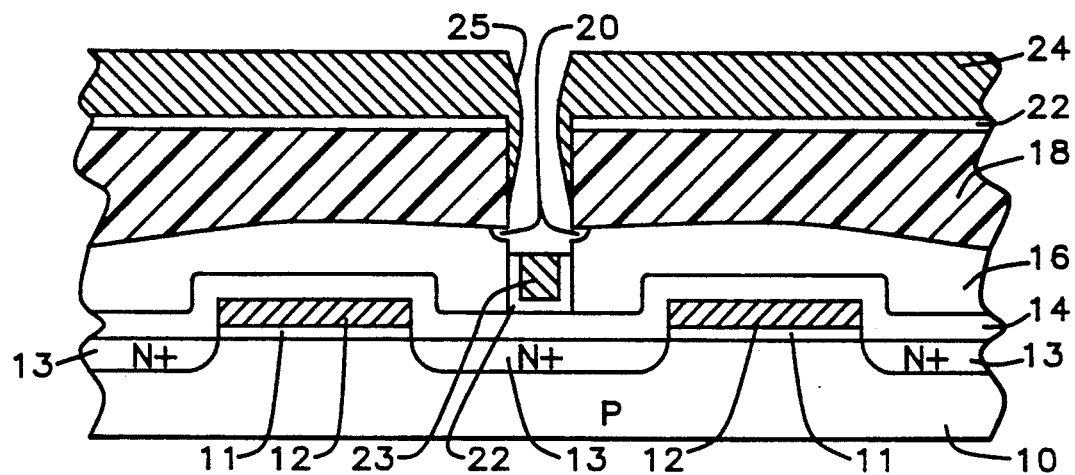

The next steps involve the deposition by sputtering of the contact metallurgy layer 22, 24. Immediately prior to the layer 22 deposition, the contact openings are treated in a short, about 5 seconds dilute (50:1 water:hydrofluoric acid) hydrofluoric acid solution to remove any silicon oxide at the bottom of the contact opening. The completion of this step is shown in FIG. 3. It is preferred that the contact metallurgy be composed of at least two layers, the barrier metal layer 22 and the thicker main portion of the metal layer 24.

Barrier metal layer 22, can either be titanium/tungsten or titanium/titanium nitride. Titanium/tungsten is done by conventional DC sputtering in argon. If titanium/titanium nitride double layer is used, it is sequentially sputtered without breaking vacuum. Titanium is first deposited in 5 to 10 mtorr argon, followed by nitrogen reactive sputtering of titanium nitride. Wafer temperature during deposition of layer 22 should be dept below about 200° C.

Metal layer 24 deposition is achieved by conventional DC sputtering. The combined resist and silicon oxide thicknesses at the contact opening determine the aspect ratio which limits the amount of metal layer 24 deposited at the bottom of the opening. Therefor, a low pressure of about 2 to 10 mtorr argon sputtering process at controlled low wafer temperature of about 150° to 200° C. for layer 24 is preferred. The upper limit to layer 24 thickness is determined by closing the opening as sputter deposition progresses. Typically, for a 1 micron opening, with 1 micron residual resist layer 18 and 1 micron silicon oxide layer 16, 2 to 3 microns of metal layer 24 can be deposited without closing up the opening.

While the sputtering process is a shadowing process and will deposit mainly upon the horizontal surfaces, there will be some deposition 25 upon the vertical sided walls as shown in FIG. 3. However, the break 20 can not be filled with the deposited metal. This is critical for the subsequent resist mask removal step of the lift off process.

The preferred materials for barrier layer 22 are TiW or Ti/TiN and the layer thickness is between about 800 to 1200 Angstroms. The preferred metals for layer 24 are aluminum and its alloy with silicon or with silicon and copper and the layer thickness is between about 8000 to 12000 Angstroms.

Figure 4:
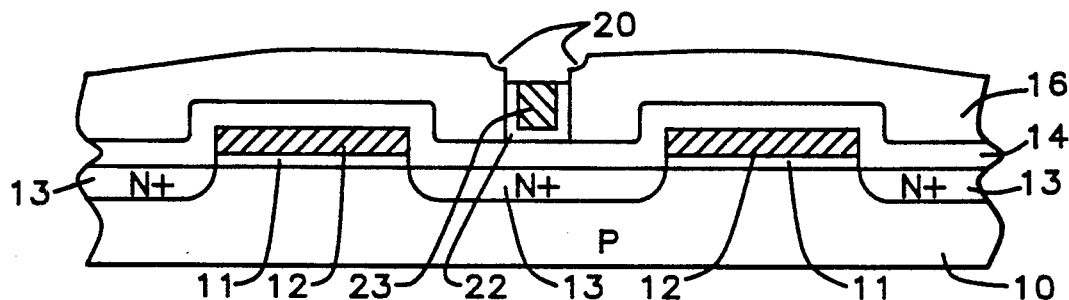

The resist mask 18 with the overlayer of metal 22, 24 is now removed or lifted off by use of a wet stripping or etching composition. The preferred composition is an acid free resist strip and the temperature is maintained at about 80° to 90° C. The etching composition is able to attack and dissolve the resist mask 18 by means of the break 20 in the vertical sided openings. The result of this resist mask 18 removal is shown in FIG. 4.

Figure 5:
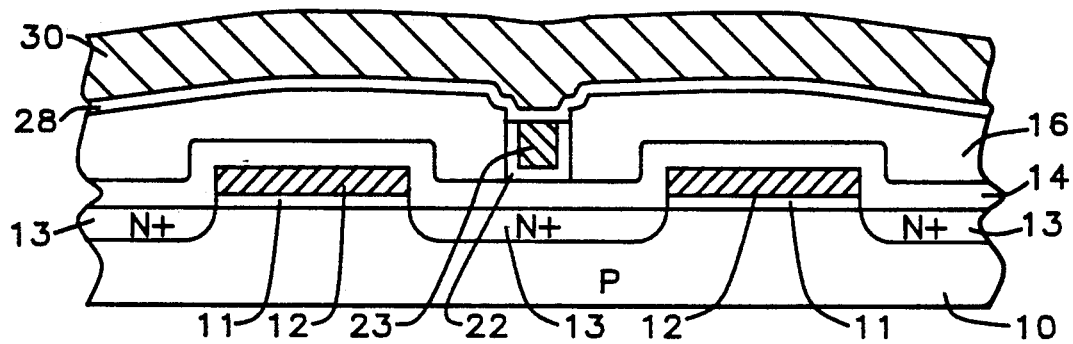

FIG. 5 illustrates deposition of a barrier metal layer 28 by sputtering, followed by deposition of metal layer 30 by sputtering. Sputtering deposition of layer 28 and 30 can be done in argon ambient of 2 to 10 mtorr at about 250° to 350° C.

Figure 6:
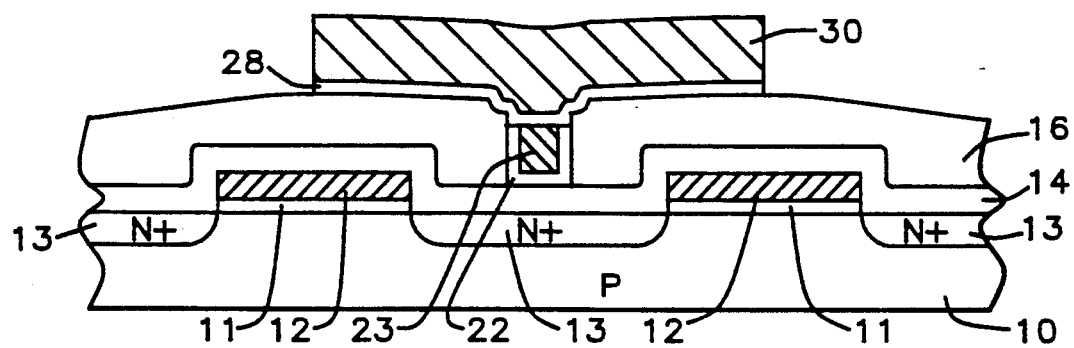
FIGS. 6 through 8 schematically illustrate in cross-sectional representation second preferred embodiment of this invention involving the formation of a via metallurgy to a metallurgy layer device regions formed above the semiconductor substrate for interconnection of the integrated circuit under construction.

The metal layer 28, 30 is now patterned by lithography and etching techniques to form the desired metallurgy pattern to complete the first level metallurgy layer 28, 30 as seen in FIG. 6.

The preferred materials for barrier layer 28 is titanium and the layer thickness is between about 800 to 1200 Angstroms. The preferred metals for layer 30 are aluminum and its alloys with silicon and/or copper and the layer thickness is between about 4000 to 6000 Angstroms.

Figure 7:
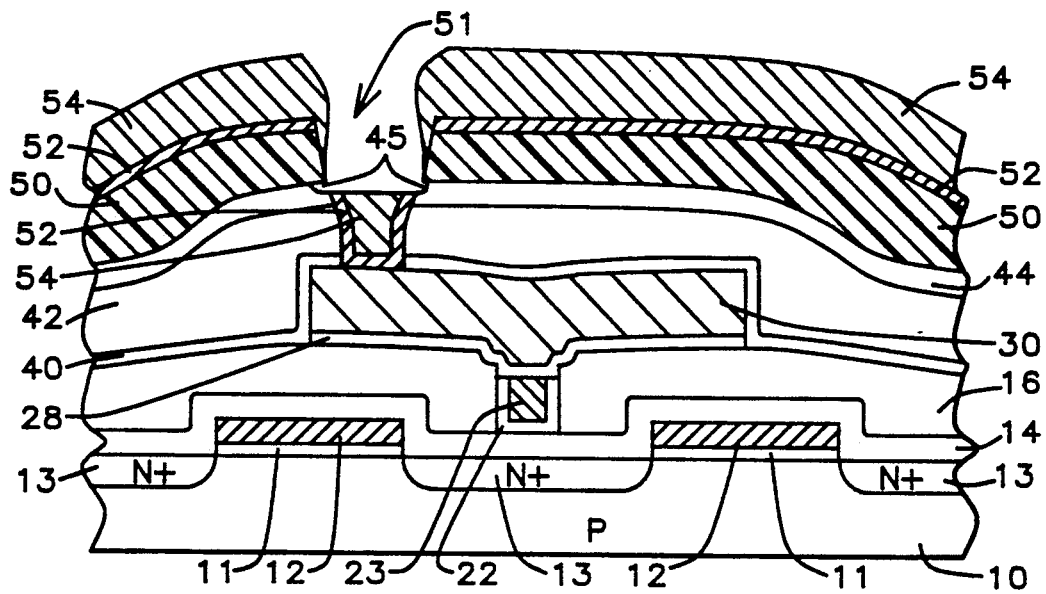
Figure 8:
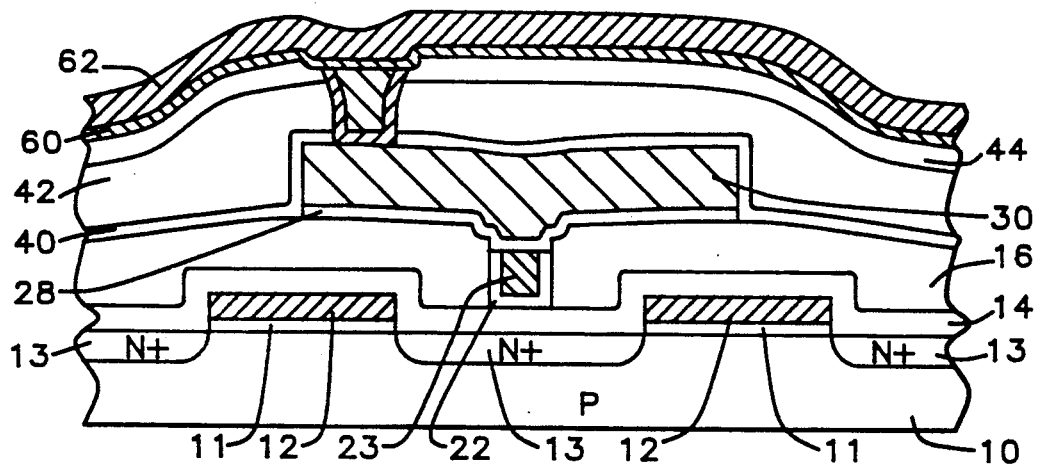

Referring now more particularly to FIGS. 7 and 8, there is shown the second embodiment wherein about one micron or less feature size via openings between metallurgy levels may be successfully filled with metal. This embodiment process begins with, for example the FIG. 6 structure. Although it is applicable for any level of metallurgy. An insulating layered structure composed of, for example a first thin layer of silicon oxide 40, a much thicker layer of a cured spin-on-glass layer 42, and a second thin layer of silicon oxide 44. The operational thicknesses of these layers are between about 1500 to 2500 Anstroms for the oxide layers and between about 2000 to 3000 or more Angstroms for the glasseous cured spin-on-glass layer. These layers are typically deposited by plasma enhanced deposition. The spin-on-glass layer can be a silicate or siloxane type as deposited.

The contact windows or openings are now formed through the insulating layered structure to the first level metal layer 30 by the new lift off and sputtering process of the present invention. A resist mask 50 is formed by lithography and etching techniques over insulating layer 40, 42, 44 to provide one micron or less openings 51 in the mask 50 over the first level metal layer 30 to be electrically contacted. The critical formation of the break 45 is formed by the use of a special isotropic etching step as described above in the first embodiment.

The next step is anisotropic etching of the remaining thickness of the insulating layer 44, 42, 40 to the first metal layer 30. A typical reactive ion etching process using carbon tetrafluoride/oxygen species and at the low pressure of about 50 mtorr accomplishes the construction of the substantially vertical sided opening to the regions 30.

The next steps involve in situ RF sputter cleaning followed by sputter deposition of the via metallurgy layer 52, 54. The completion of this step is shown in FIG. 7. It is preferred that the contact metallurgy be composed of at least two layers, the barrier layer 52 and the thicker main portion of the contact layer 54. This sputtering deposition is accomplished by as described in the first embodiment.

The sputtering process is a shadowing process and will normally only deposit upon the horizontal surface and not the vertical surfaces, when the openings are very small there will be some deposition upon the vertical sided walls as shown in FIG. 7. However, the break 45 can not be filled with the deposited metal. This is critical for the subsequent resist mask removal step of the lift off process.

The preferred materials for barrier layer 52 is titanium and the layer thickness is between about 800 to 1200 Angstroms. The preferred metals for layer 54 are aluminum and its silicon and/or copper alloys and the layer thickness is between about 8000 to 12000 Angstroms.

The resist mask 50 with the overlayer of metal 52, 54 is now removed or lifted off by use of a stripping or etching composition and conditions as above described in the first embodiment. The etching composition is able to attack and dissolve the resist mask 50 by means of the break 45 in the vertical sided openings. The result is the removal of resist mask 50.

The next level barrier metal layer 60 and second level metallurgy 62 are deposited in similar fashion to that of the first embodiments deposition of layers 28 and 30. The second level metal layer 60, 62 is now patterned (not shown) by lithography and etching techniques to form the desired metallurgy pattern to complete the second level metallurgy layer.

The preferred materials for barrier layer 60 is titanium and the layer thickness is between about 800 to 1200 Angstroms. The preferred metals for layer 62 are aluminum and silicon and/or copper alloys and the layer thickness is between about 8000 to 12000 Angstroms.

The process can be repeated for other levels of metallurgy and insulating layers.

While the invention has been particularly shown and described with reference to the preferred embodiments thereof, it will be understood by those skilled in the art that various changes in form and details may be made without departing from the spirit and scope of the invention.

What is claimed is:

1. A method for making electrical contact through an opening of about one micron or less comprising:
   providing semiconductor device structures in and on a semiconductor substrate;
   forming an insulating layer structure over said semiconductor device structures;
   forming a resist mask with at least one substantially vertical sided opening of said one micron or less feature size in the mask over said insulating layer and above the device elements to be electrically contacted thereby exposing said insulating layer;
   isotropic etching partially through the exposed said insulating layer to a depth of between about 500 to 850 Angstroms to form an undercut region in said insulating layer beneath the edge of said vertical sided opening in said resist mask:
   thereafter anisotropically etching the remaining thickness of the exposed said insulating layer to complete the construction of a substantially vertical sided opening of a diameter similar to the vertical sided opening in said resist mask through said insulating layer to a device element to be electrically contacted;
   sputter depositing a metal layer over the exposed surfaces including the bottom of said vertical sided openings, while substantially not depositing said metal upon said vertical sides of said openings;
   removing said resist mask and said metal thereover by etching with the said break being the attacking point of the resist etching fluid; and
   depositing a next level metallurgy over the exposed surfaces including said metal remaining in said vertical openings to form said next metallurgy level and to complete said electrical contact.

2. The method of claim 1 wherein said device elements to be electrically contacted are regions within said semiconductor itself.

3. The method of claim 2 wherein said regions are source/drain regions of a CMOS integrated circuit.

4. The method of claim 1 wherein said device elements are a metallurgy layer and the said electrical contact is a via metallurgy between metal layer in said integrated circuit.

5. The method of claim 1 wherein said insulating layer is composed of a thin layer of silicon oxide having a thickness of between about 500 to 1000 Angstroms and an overlying thicker layer of borophosphosilicate glass having a thickness between about 4000 to 6000 Angstroms.

6. The method of claim 1 wherein said isotropic etching fluid in composed of hydrofluoric acid, applied to suitable time to underetch said resist mask by between about 500 to 850 Angstroms.

7. The method of claim 1 wherein said sputter metal layer is composed of a barrier metal layer and a thicker metal layer and the aspect ratio of said openings is between about 1 to 1.5.

8. The method of claim 7 wherein said barrier metal layer is titanium and said thicker metal layer is aluminum.

9. The method of claim 1 wherein said next level metallurgy is composed of a barrier layer and a thicker metal layer.

10. The method of claim 9 wherein said barrier metal layer is titanium and said thicker metal layer is alumiuum/silicon/copper.

11. A method for making electrical contact through an opening of about one micron or less to source/drain regions of a CMOS integrated circuit comprising:
   providing CMOS semiconductor device structures in and on a semiconductor substrate including said source/drain regions;
   forming an insulating layer structure over said semiconductor device structures;
   forming a resist mask with a substantially vertical sided opening of said one micron or less feature size in the mask over said insulating layer and above the said source/drain region to be electrically contacted;
   isotropic etching partially through the exposed said insulating layer to a depth of between about 500 to 800 Angstroms to form an undercut region in said insulating layer beneath the edge of said vertical sided opening in said resist mask;
   thereafter anisotropically etching the remaining thickness of the exposed said insulating layer to complete the construction of a substantially vertical sided opening of a diameter similar to the vertical sided opening in said resist mask through said insulating layer to a device element to be electrically contacted;

sputter depositing a metal layer over the exposed surfaces including the said source/drain regions at the bottom of said vertical sided openings, while substantially not depositing said metal upon said vertical sides of said openings;

removing said resist mask and said metal thereover by etching with the said break being the attacking point of the resist etching fluid; and depositing a next level metallurgy over the exposed surfaces including said metal remaining in said vertical openings to form said next metallurgy level and to complete said electrical contact.

12. The method of claim 11 wherein said insulating layer is composed of an overlying thin layer of silicon oxide having a thickness of between about 500 to 1000 Angstroms and a thicker layer of borophosphosilicate glass having a thickness between about 4000 to 6000 Angstroms.

13. The method of claim 11 wherein said isotropic etching fluid in composed of hydrofluoric acid, applied to suitable time to underetch said resist mask by between about 500 to 800 Angstroms.

14. A method for making electrical contact through a via opening of about one micron or less from one metallurgy layer to another comprising:
providing semiconductor device structures in and on a semiconductor substrate including a metallurgy layer;
forming an insulating layer structure over said metallurgy layer;
forming a resist mask with a substantially vertical sided opening of said one micron or less feature size in the mask over said insulating layer and above the said metallurgy layer to be electrically contacted;
isotropic etching partially through the exposed underlying said insulating layer to a depth of between about 500 to 800 Angstroms to form undercut regions in said insulating layer beneath the edges of said vertical sided openings in said resist mask;

thereafter anisotropically etching the remaining thickness of the exposed said insulating layer to complete the construction of said substantially vertical sided openings of a diameter similar to the vertical sided openings in said resist mask through said insulating layer to said metallurgy layer to be electrically contacted;

sputter depositing a metal layer over the exposed surfaces including the bottom of said vertical sided openings, while substantially not depositing said metal upon said vertical sides of said openings;

removing said resist mask and said metal thereover by etching with the said break being the attacking point of the resist etching fluid; and depositing a next level metallurgy over the exposed surfaces including said metal remaining in said vertical openings to form said next metallurgy level and to complete said electrical contact.

15. The method of claim 14 wherein said insulating layer is composed of a first thin layer of silicon oxide having a thickness of between about 1500 to 2500 Angstroms, a cured spin-on-layer having a thickness between about 2000 to 3000 Angstroms and a second thin layer of silicon oxide having a thickness between about 4000 to 5000 Angstroms.

16. The method of claim 14 wherein said isotropic etching fluid in composed of buffered hydrofluoric acid, applied to suitable time to underetch said resist mask in the second layer of silicon oxide by between about 500 to 800 Angstroms.

17. The method of claim 14 wherein said sputter metal layer is composed of a barrier metal layer and a thicker metal layer and the aspect of said openings is between about 1 to 1.5.

18. The method of claim 17 wherein said barrier metal layer is titanium and said thicker metal layer is aluminum.

19. The method of claim 14 wherein said next level metallurgy is composed of a barrier layer and a thicker metal layer.

20. The method of claim 19 wherein said barrier metal layer is titanium and said thicker metal layer is aluminum/silicon/copper.

* * * * *